United States Patent
Nakayama

(10) Patent No.: US 7,358,495 B2
(45) Date of Patent: *Apr. 15, 2008

(54) STANDARD REFERENCE FOR METROLOGY AND CALIBRATION METHOD OF ELECTRON-BEAM METROLOGY SYSTEM USING THE SAME

(75) Inventor: Yoshinori Nakayama, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/481,973

(22) Filed: Jul. 7, 2006

(65) Prior Publication Data

US 2006/0289756 A1    Dec. 28, 2006

Related U.S. Application Data

(63) Continuation of application No. 11/028,219, filed on Jan. 4, 2005, now Pat. No. 7,078,691.

(30) Foreign Application Priority Data

Feb. 25, 2004 (JP) ............................. 2004-049218

(51) Int. Cl.
  *G21K 7/00* (2006.01)
(52) U.S. Cl. ................ 250/310; 250/491.1; 250/492.1; 250/492.2; 250/311
(58) Field of Classification Search ................. 250/310
  See application file for complete search history.

(56) References Cited

U.S. PATENT DOCUMENTS

| 5,422,723 | A | 6/1995 | Paranjpe et al. |
| 6,566,654 | B1 | 5/2003 | Funatsu et al. |
| 2004/0263846 | A1 | 12/2004 | Kwan |

FOREIGN PATENT DOCUMENTS

| JP | 07-071947 | 3/1995 |
| JP | P2000-232138 A | 8/2000 |
| JP | P2001-127125 A | 5/2001 |
| JP | 2004-251682 | 9/2004 |

*Primary Examiner*—Nikita Wells
*Assistant Examiner*—James J Leybourne
(74) *Attorney, Agent, or Firm*—Antonelli, Terry, Stout & Kraus, LLP.

(57) ABSTRACT

An electron-beam metrology system includes a specimen stage to mount a specimen on which a device pattern is formed, electron optics to radiate the device pattern with an electron-beam, a secondary electron detector to detect a secondary electron generated by the radiation of the electron-beam, and an information processing system to analyze a signal obtained from the secondary electron detector. A standard reference for metrology is held on the specimen stage, and the standard reference includes a first grating unit pattern including an array of gratings having pitch sizes which are verified by an optical method, and a second grating unit pattern including an array of gratings having pitch sizes which are smaller than the pitch sizes of the first grating unit pattern.

14 Claims, 12 Drawing Sheets

FIG. 6
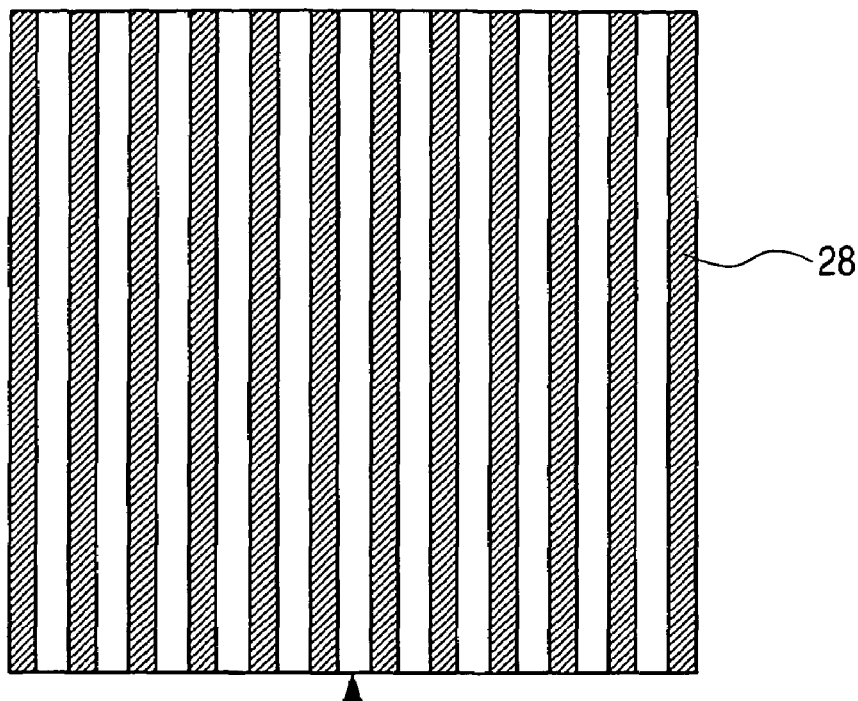
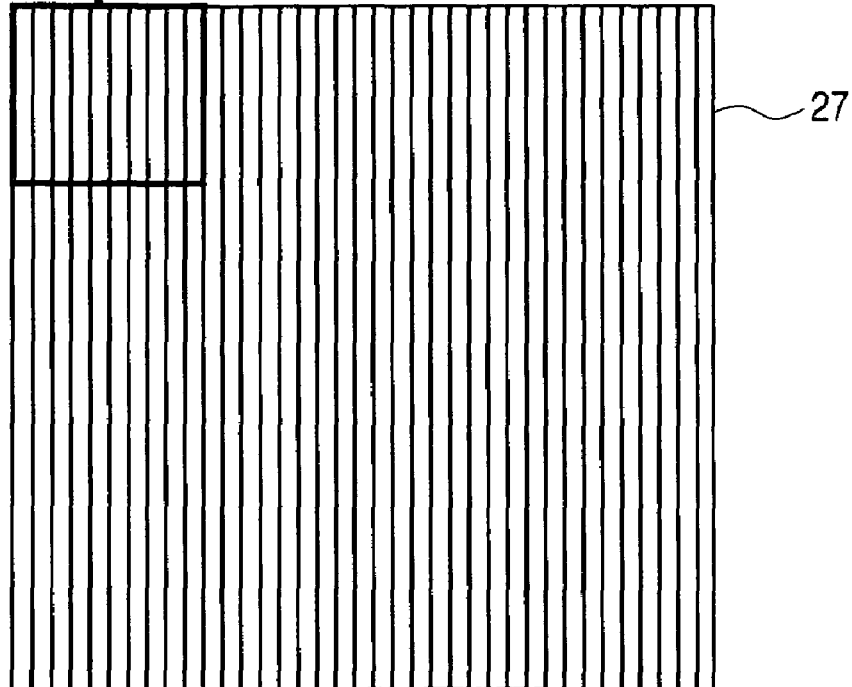
ENLARGED VIEW

STANDARD REFERENCE FOR METROLOGY AND CALIBRATION METHOD OF ELECTRON-BEAM METROLOGY SYSTEM USING THE SAME

CROSS REFERENCE TO RELATED APPLICATIONS

This application is a continuation of U.S. application Ser. No. 11/028,219, filed Jan. 4, 2005, now U.S. Pat. No. 7,078,691, the contents of which are incorporated herein by reference.

CLAIM OF PRIORITY

The present invention claims priority from Japanese application JP 2004-049218 filed on Feb. 25, 2004, the content of which is hereby incorporated by reference on to this application.

BACKGROUND OF THE INVENTION

The present invention relates to electron-beam metrology including a standard reference for metrology used in electron-beam metrology.

Standard references for metrology for electron-beam metrology according to the prior art use a grating which is fabricated over a semiconductor substrate by laser interferometer lithography and anisotropic chemical etching. Their calibration is accomplished by measuring the diffraction angle of grating by the use of a laser beam whose absolute accuracy is guaranteed (see, for instance, Japanese Patent Application Laid-Open No. 7-71947).

SUMMARY OF THE INVENTION

The minimum possible dimensions for the standard references mentioned are determined by the resolution limit of laser interferometer lithography. The lower limit of the pitch is ½ of the wavelength of the laser beam that is used. The minimum possible pitch of argon ion lasers of 351.1 nm in wavelength currently used in a laser interferometer lithography system is about 200 nm. Exposure devices whose laser beam source is altered to a shorter wavelength involve many problems, and are difficult to develop. Similarly, there is a limit to the accuracy of diffraction angle measurement of grating using a laser beam for the calibrating purpose, and such measuring is impossible at a minimum pitch below 200 nm approximately.

On the other hand, as semiconductor devices are ever more reduced in size, the minimum machining dimension is now less than 100 nm. Whereas the dimensional management of such ultra-fine machining uses an electron-beam metrology system, standard references of dimensions are indispensable for the absolute accuracy management of such a system. However, conventional standard references of dimensions cannot meet the requirements of the minimum machining dimensions of the latest semiconductor devices.

Moreover, the patterning of grating using laser interferometer lithography can prepare only simple line and space patterns very because of its principle. For this reason, the same pattern is formed all over the specimen, making it impossible to form positioning marks. Therefore, it cannot be accurately specify the position of the grating pattern which was used in calibration with a pitch size proving device and a metrology system. Where an electron-beam metrology system is used, consecutive use of any specific pattern would invite deterioration in calibration accuracy because the sticking of contamination ensuing from irradiation with a beam gives rise to dimensional variations in the specimen.

An object of the present invention, attempted in view of the problems noted above, is to provide a standard reference for metrology having finer reference sizes and high-precision electron-beam metrology including the same.

In order to achieve the object stated above, in the basic configuration according to the invention, finer pattern areas than a conventional grating pattern are formed over a plurality of identical semiconductor members separately from the conventional grating pattern. Thus, the pitch size of a grating pattern of not less than 200 nm, which is the pitch size of the conventional grating pattern, is figured out by diffraction angle measurement of the grating using a laser beam, and the pitch size so figured out is used as an absolute size. Apart from this grating pattern, a grating pattern whose minimum pitch size is not more than 100 nm is formed over the same semiconductor member. Since the proof of this pattern is impossible by conventional diffraction angle measurement of the grating using a laser beam whose wavelength is absolutely guaranteed, the pitch size of the conventional grating pattern, figured out as described above as the absolute size by using an electron-beam metrology system, a scanning probe microscope or a deep ultraviolet short-wavelength laser of which the wavelength is not necessarily guaranteed absolutely, is used as reference.

This makes possible, by arranging a pattern of or above a length for the same scanning range of an electron-beam or a probe, calibration permitting ready beam addressing. Further by arranging near this pattern a mark pattern whose shape is easily distinguishable from other patterns, recording of positional information measured with an electron-beam or a probe is made possible. Thus, by arranging a pattern permitting conventional diffraction angle measurement of grating by the use of a laser beam and a fine pattern matching the minimum machining dimensions of the latest semiconductor devices within the same member, a standard reference for metrology and calibration by which fineness and high accuracy are made compatible can be realized.

Further, by arranging patterns in the vertical direction and patterns in the lateral direction within the same member, unprecedented size calibration in both vertical and lateral directions can be realized at the same level of accuracy. By keeping the distance between these pattern units within 20 μm, calibration can be accomplished under the same optical conditions of the electron-beam metrology system, and accordingly a higher level of accuracy can be achieved.

Next will be described how this standard reference for metrology is fabricated. A conventional grating pattern and a fine pattern matching minimum machining dimensions of the latest semiconductor devices cannot be arranged within the same member by laser interferometer lithography using a conventional standard reference for metrology because of its limitation in resolution and in the freedom of pattern creation. In view of this problem, the invention uses electron-beam delineation excelling in resolution and unlimited in pattern shaping. For the fabrication of a highly accurate standard reference for metrology improved in uniformity in the specimen plane, an electron-beam cell projection exposure method by which the desired pattern is formed into a stencil mask and projected in a reduced size with an electron-beam for exposure is particularly effective. Thus, since a plurality of kinds of delineation patterns of grating in the vertical and lateral directions are all fabricated into stencil masks, accurately reproducible patterning is possible without dimensional variations from shot to shot by selecting the desired mask by beam deflection and exposing it to light repetitively. Combination of this patterning method and dry etching makes possible fine standard references for metrology suitable for use with an electron-beam metrology system of a scanning probe microscope. Formation of square apertures in stencil masks in advance would make possible variable shaped delineation with no limitation of the variety of patterns.

When a fine size is to be measured in calibrating an electron-beam metrology system with this standard reference, size calibration is accomplished with a proven fine grating pattern by using an electron-beam metrology system, a scanning probe microscope or a deep ultraviolet solid-state short-wavelength laser. Proper accomplishment of the calibration can be confirmed by measuring, after this calibration, the pitch size of a proven grating with a laser beam whose wavelength is absolutely guaranteed. The configuration is such that, if the measured size and the pitch size figured out from the diffraction angle surpass the reference, the electron-beam metrology system issues an alarm, and another fine pattern is used in that case. Thus, by calibrating the electron-beam metrology system again by using a fine pattern in another location than the previously used fine grating with reference to the mark pattern, the high level of calibration accuracy can be maintained.

Typical examples of configuration according to the invention will be described below.

(1) A standard reference for metrology according to the invention includes, disposed over a substrate, a first grating unit pattern formed of an array of gratings whose pitch size is figured out in advance by optical means, and a second grating unit pattern formed of an array of gratings smaller than the first grating unit pattern in pitch size.

(2) In the standard reference for metrology described in (1) above, the minimum pitch size of the second grating unit pattern may not be greater than 100 nm.

(3) In the standard reference for metrology described in (1) above, a first pattern area in which a plurality of the first grating unit patterns are arranged and a second pattern area in which a plurality of the second grating unit patterns are arranged may be disposed over the substrate.

(4) In the standard reference for metrology described in (1) above, a mark pattern for beam addressing of probing means for use in metrology may be provided over the substrate.

(5) In the standard reference for metrology described in (3) above, the second pattern area may contain a plurality of mark patterns including positional information on each of the plurality of the second grating unit patterns.

(6) The standard reference for metrology described in (1) above may further have, over the substrate, a third grating unit pattern formed of gratings arrayed in a direction different from the gratings constituting the first grating unit pattern and a fourth grating unit pattern formed of gratings arrayed in a direction different from the gratings constituting the second grating unit pattern, wherein the pitch size of the fourth grating unit pattern is smaller than the pitch size of the third grating unit pattern.

(7) In the standard reference for metrology described in (6) above, a first pattern area in which a plurality of the first grating unit patterns are arranged, a second pattern area in which a plurality of the second grating unit patterns are arranged, a third pattern area in which a plurality of the third grating unit patterns are arranged, and a fourth pattern area in which a plurality of the fourth grating unit patterns are arranged may be disposed over the substrate.

(8) In the standard reference for metrology described in (6) above, the first grating unit pattern and the third grating unit pattern may be arranged to form a grating with each other may be and the second grating unit pattern and the fourth grating unit pattern, arranged to form a grating with each other.

(9) In the standard reference for metrology described in (1) or (6) above, a distance between the grating unit patterns may be within 20 μm.

(10) A method of calibration of electron-beam metrology systems according to the invention is a method using a standard reference for metrology to perform measurement by scanning a prescribed area of a specimen with an electron-beam, wherein the standard reference for metrology is provided, over a substrate, with a first grating unit pattern formed of an array of gratings whose pitch size is figured out in advance by optical means and a second grating unit pattern formed of an array of gratings whose pitch size is smaller than that of the first grating unit pattern, the first grating unit pattern is measured, a difference between a result of the measurement and the pitch size is calculated and compared with a reference value and, if the difference is greater than the reference value, the second grating unit pattern is measured to calibrate the measured value.

(11) An electron-beam metrology system according to the invention has a specimen mounting stage for holding a specimen, electron optics for scanning the specimen on the specimen mounting stage with an electron-beam, a secondary electron detector for detecting a secondary electron-beam generated by the scanning with the electron-beam, operation treatment means for measuring the specimen by analyzing a signal waveform obtained from the detector, display means for displaying a result of the measurement, storage means in which reference sizes are stored for use in calibrating the result of measurement, and a standard reference for metrology held on the specimen mounting stage, wherein the standard reference for metrology is provided, over a substrate, with a first grating unit pattern formed of an array of gratings whose pitch sizes are found in advance by optical means, and a second grating unit pattern formed of an array of a plurality of gratings smaller than the first grating unit pattern in pitch size, and the operation treatment means compares a result of the measurement and the reference sizes and, if a different surpasses a certain value, causes the display means to display abnormality of calibration.

According to the invention, a standard reference for metrology having a finer reference size and highly accurate electron-beam metrology including the same can be realized.

BRIEF DESCRIPTION OF THE DRAWINGS

FIG. 6 shows an example of pattern for calibration according to the prior art.

DETAILED DESCRIPTION OF THE PREFERRED EMBODIMENTS

Preferred embodiments of the present invention will be described in detail below with reference to accompanying drawings.

FIG. 1 through FIG. 5 show one example of standard reference for beam metrology according to the invention. FIG. 6 shows an example of standard reference for metrology for an electron-beam metrology system according to the prior art.

Conventionally, the trench pattern of unevenness on the semiconductor substrate of orientation (110) is prepared as a grating pattern 28 in a fixed direction by laser interferometer lithography and wet etching as shown in FIG. 6. The pitch of the grating pattern 28 is about 200 nm, and this value is obtained by diffraction angle measurement using a laser. The grating pattern 28 is formed all over a standard reference substrate 27 of 4 mm square. Calibration of an electron-beam metrology system using this reference substrate would involve the following problems.

The first problem concerns fineness. The latest semiconductor patterns include some whose minimum machining dimension is less than 100 nm. However, as the minimum pitch of conventional grating patterns by laser interferometer lithography is 200 nm, a full pitch of a grating pattern overflows the field of view of image of 200,000 or more magnifications for use in semiconductor pattern metrology, making calibration impossible at this level of magnification. The second problem is posed by the impossibility to identify the position of calibration because of the pattern uniformity all over the specimen. For this reason, a plurality of points in the specimen are measured and the measurements are averaged, resulting in a correspondingly long time taken for calibration. Furthermore, a grating in only one direction can be prepared for a pattern of unevenness on the semiconductor substrate of orientation (110). This means a disadvantage that dimensional calibration can be accomplished in only one direction.

By contrast, according to the invention, an electron-beam cell projection exposure method is used for pattern exposure and a dry process for etching. Though this method permits patterning of 100 nm or less in pitch, diffraction angle measurement is optically difficult for a grating of this pitch size because its wavelength is proven as an absolute size because of a wavelength limit.

Figure 1:
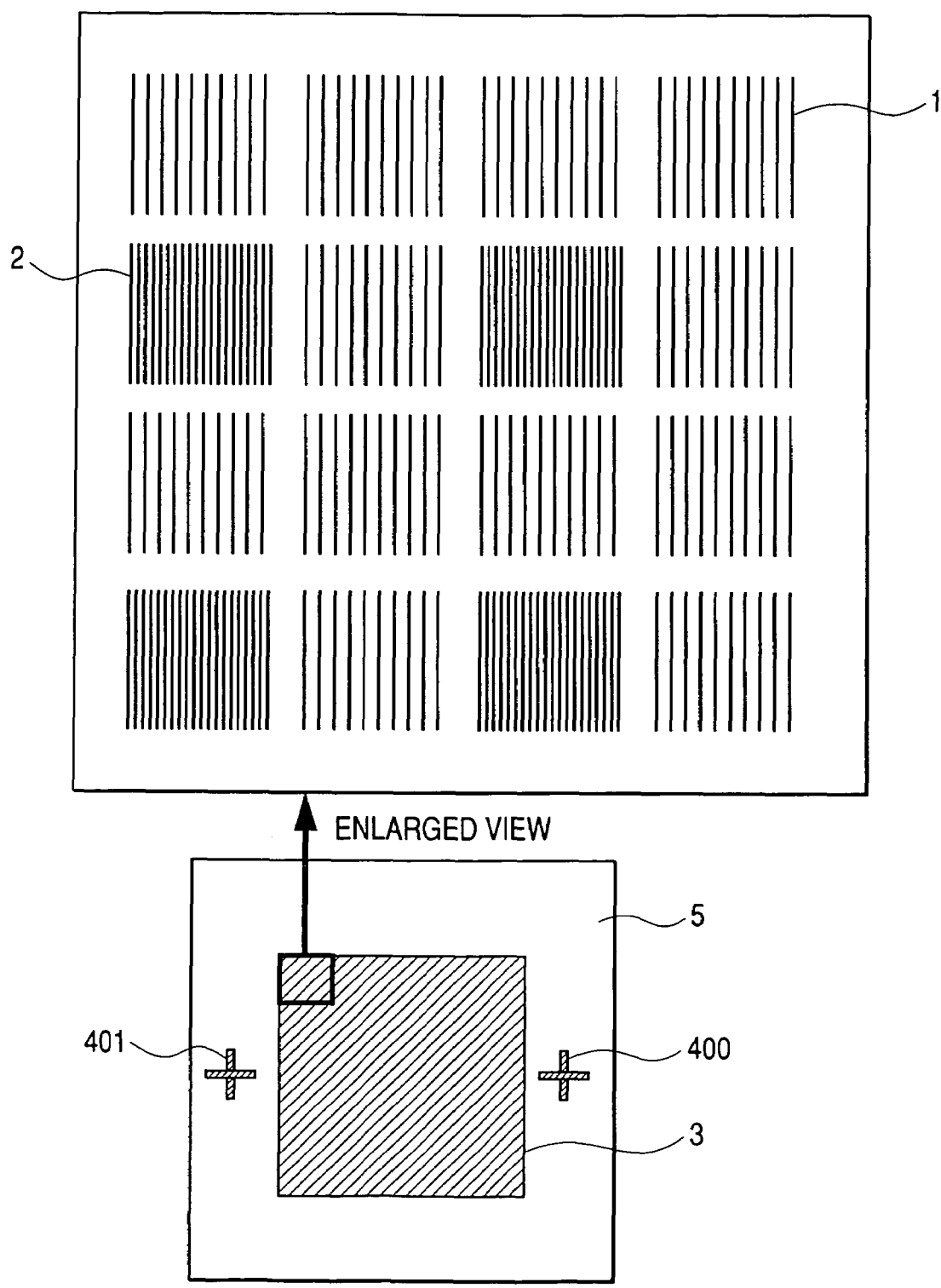
FIG. 1 shows an example of pattern array for calibration in a standard reference for metrology according to the present invention.

In view of this difficulty, a grating pattern shown in FIG. 1 was prepared in the calibration pattern area 3 of a standard reference substrate 5. This grating pattern is formed of grating unit patterns 1 in each of which 10 trenches of 2 μm in length are arrayed at a pitch of 200 nm and which are arranged at pitches of 2.5 μm and 2.4 μm in the vertical and lateral directions, respectively. In part of this array, grating unit patterns 2, in each of which 20 trenches of 2 μm in length are arrayed at a pitch of 100 nm, are arranged. Around the periphery of the calibration pattern area 3, cross patterns for beam addressing 400 and 401 of probing means for measurement use are arranged. In the standard reference, the standard reference substrate 5 of 5 mm square containing these patterns and the calibration pattern area in which trenches of the aforementioned grating unit patterns are arrayed in the vertical direction (or the lateral direction) are arranged.

By measuring the diffraction angle by irradiating this standard reference with an He—Cd laser whose wavelength was guaranteed as an absolute size, it was proven that the pitch size of the grating unit pattern 1, containing 10 trenches at a pitch of 200 nm, was 200.01 nm with a tolerance of 0.01 nm. The pitch size of the grating unit pattern 2, containing 20 trenches at a pitch of 100 nm, was determined by using a scanning probe microscope (e.g. an AFM) in the following manner, and a value of 100.45 nm was obtained. First, in search for a grating unit pattern, the parallelism between the moving directions of the standard reference and the scanning probe microscope was corrected by using the cross patterns for beam addressing 400 and 401, and the position of each grating unit was kept at or below 2 μm. Then, the pitch size of the grating unit pattern 1 containing 10 trenches at a pitch of 200 nm in the array was measured, and after carrying out size calibration of the scanning probe microscope by setting this size to 200.01 nm, the pitch size of the grating unit pattern 2 was measured. Since the length of the grating unit pattern 2 was 2 μm, the scanning by the scanning probe microscope could be positioned to the grating unit pattern with an accuracy of 100%, and the pitch size was successfully figured out from the measurement of a 19-pitch equivalent. In the same way, the pitch sizes of 20 or more different grating unit patterns 2 were figured out, and their average was determined to be 100.45 nm.

Figure 7:
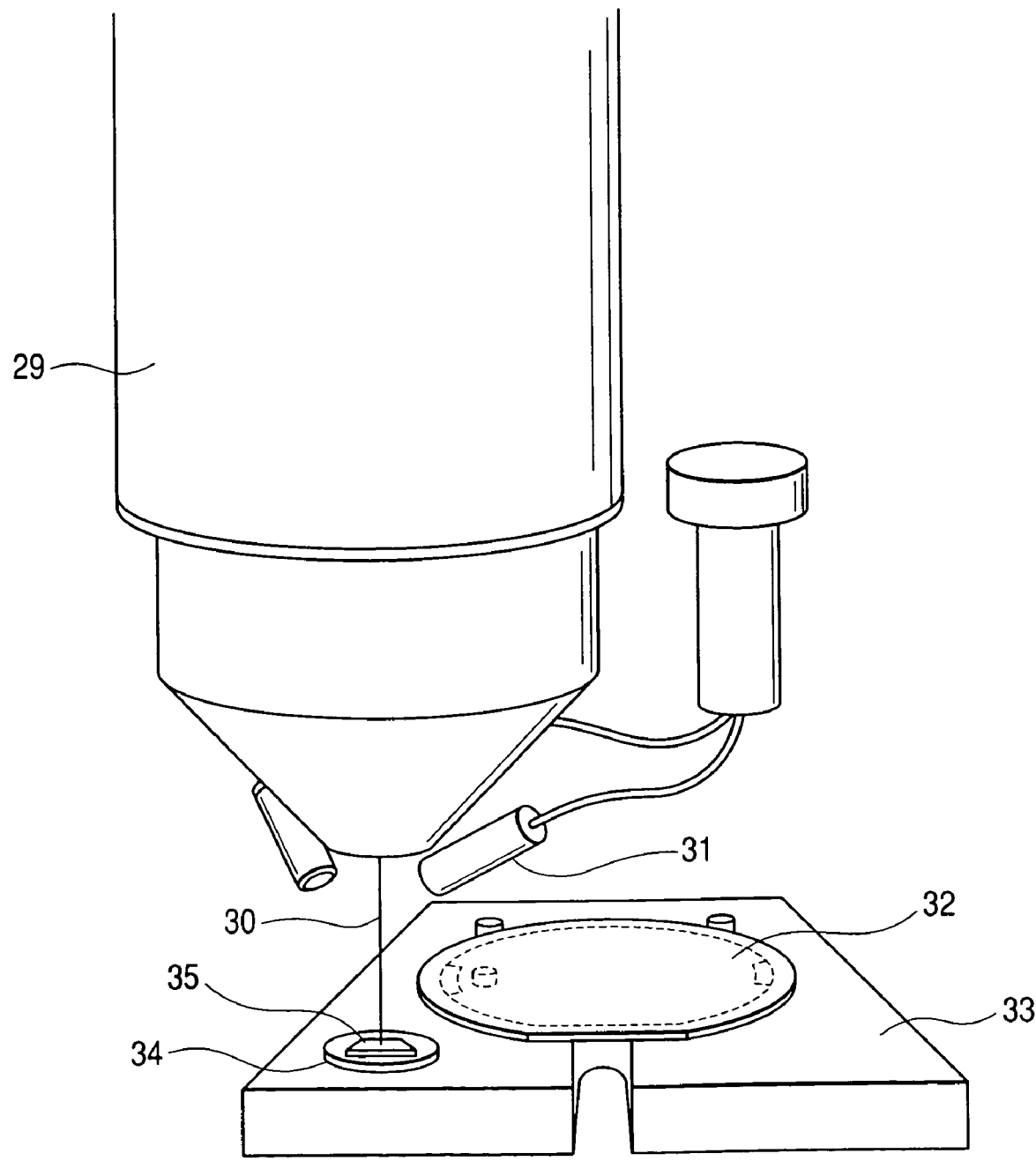
FIG. 7 illustrates an electron-beam metrology system mounted with a standard reference for metrology.

Next will be described how the electron-beam metrology system using this standard reference for metrology is calibrated. A specimen wafer 32 containing a device pattern of 50 nm in designed size and a standard reference 35 fitted to a holder 34 are mounted on the stage 33 of the electron-beam metrology system as shown in FIG. 7. The device pattern of 50 nm in designed size is measured with the electron-beam metrology system at 200,000 or more magnifications. At this level of magnification, a full pitch of a grating of 200 nm in pitch which is the conventional size standard, cannot be covered by scanning with an electron-beam 30 focused by electron optics 29, and accordingly the system cannot be calibrated.

For the calibration of this magnification level, the pitch size of the grating unit patterns 2 was measured with the electron-beam metrology system. First to search for the grating unit pattern 2 in which 20 trenches were arrayed at a pitch of 100 nm, the parallelism between the moving directions of the specimen and the electron-beam metrology system was corrected by using the cross patterns for beam addressing 400 and 401. Next, the pitch size of the grating unit pattern 2 within the array was measured with the secondary electron signal waveform from a secondary electron detector 31. In the same way, the pitch sizes or 20 or more different grating unit patterns 2 were figured out, and their average was determined to be 100.45 nm to make possible calibration.

To confirm the correctness of this calibration, the pitch size of the grating unit pattern 1 containing 10 trenches at a pitch of 200 nm in the array was measured at a magnifying power of 100,000, which permitted one pitch to be covered by the scanning range, and was determined to be 200.06 nm. In this standard reference, as the distance between the grating unit pattern 2 in which 20 trenches were arrayed at a pitch of 100 nm and the grating unit pattern 1 containing 20 trenches at a pitch of 200 nm was 2.5 µm, i.e. within the 20 µm range in which measurement was possible without altering the focusing condition of the electron optics 29 of the electron-beam metrology system, calibration of high accuracy could be realized. As a result, the difference from the pitch size of 200.01 nm obtained by measuring the diffraction angle was 0.05 nm, indicating a satisfactory level of accuracy.

Figure 8:
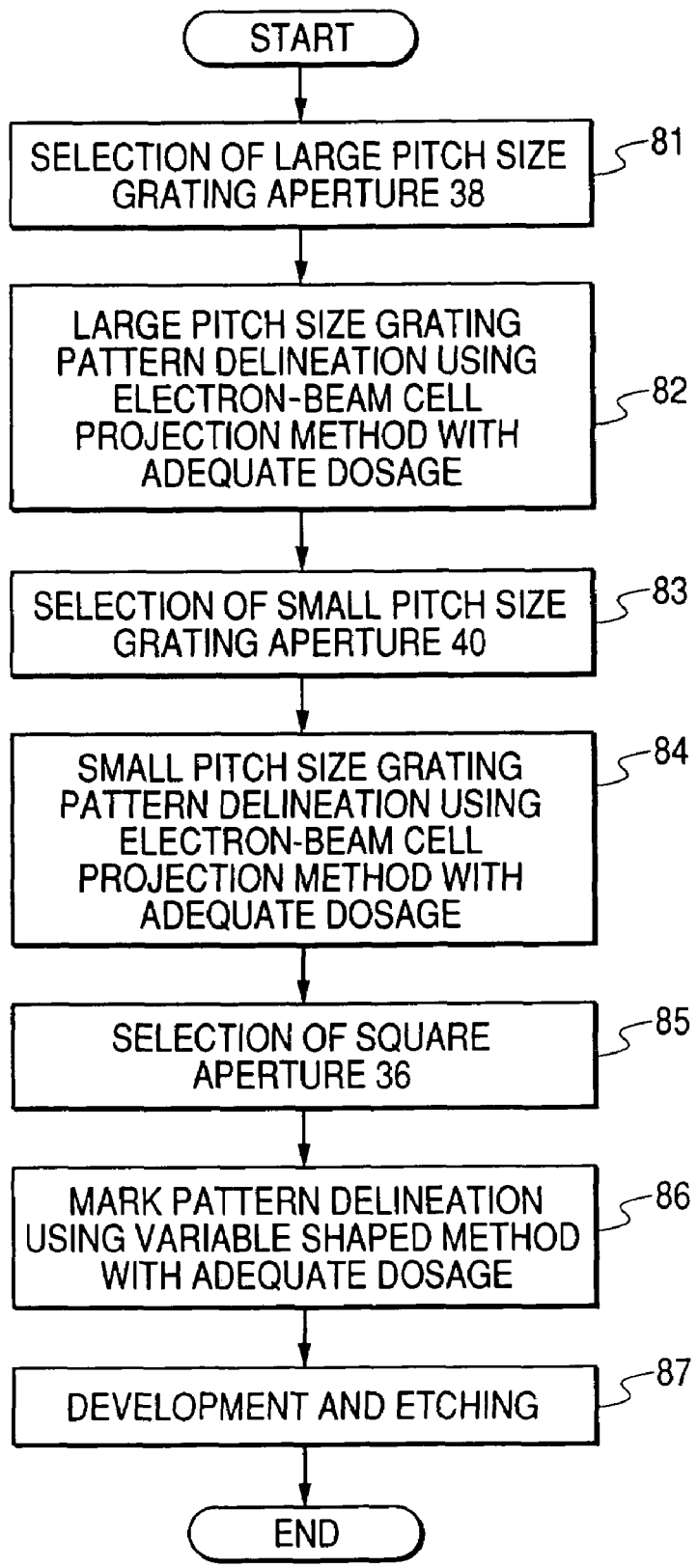
FIG. 8 shows an example of flow in the fabrication of a pattern for calibration in the standard reference for metrology according to the invention.
Figure 9:
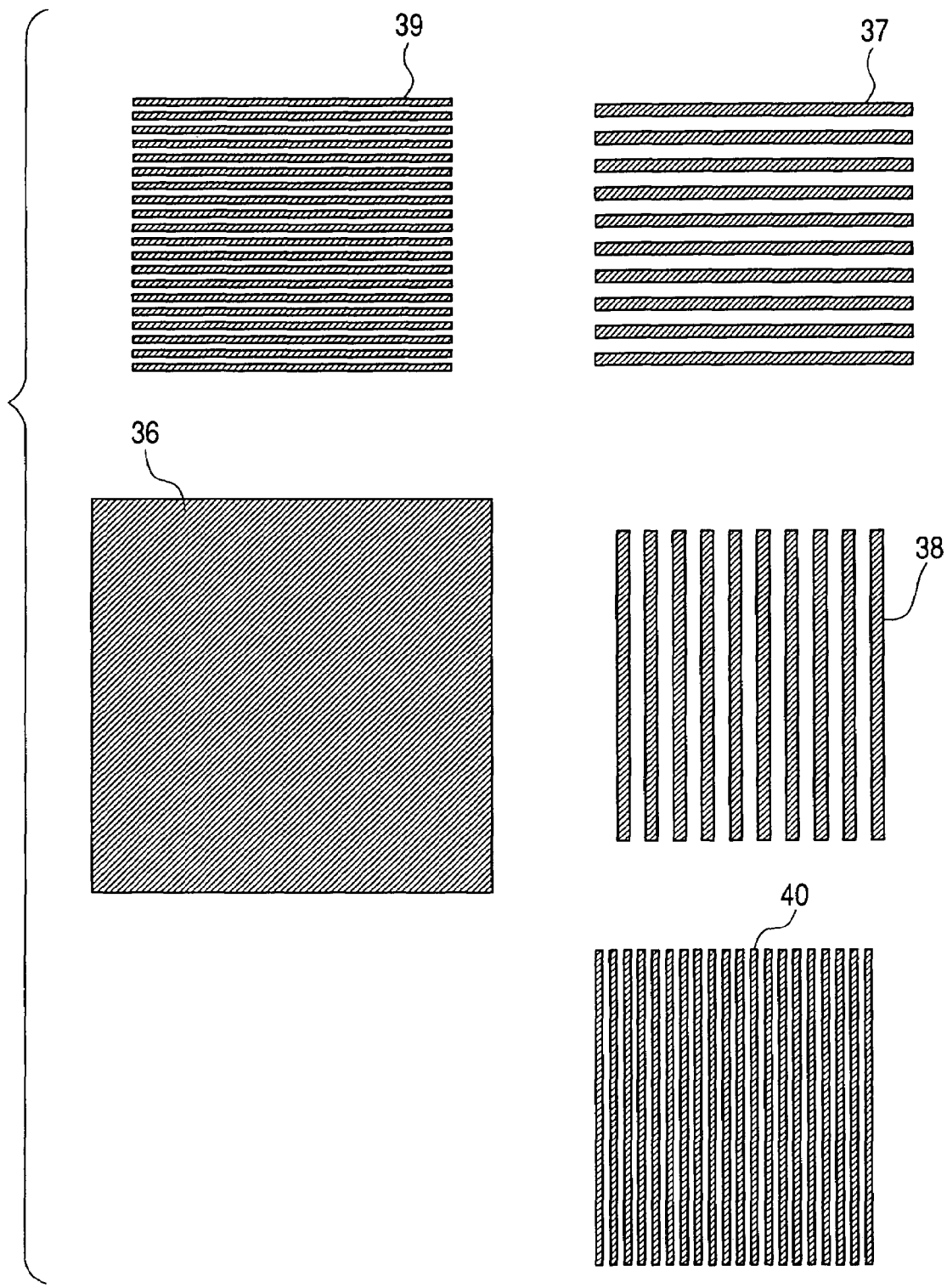
FIG. 9 illustrates a stencil mask for an electron-beam cell projection exposure system and a beam scanning position.

Next, the method of fabricating the standard reference for metrology according to the present invention will be described. First, after an oxide film of 100 nm was formed over an Si substrate, the surface was coated with a resist. Then, in the flow of fabrication charted in FIG. 8, pattern formation was carried out with an electron-beam cell projection exposure system mounted with stencil masks having apertures 10 and 11 shown in FIG. 9.

An aperture 38 corresponding to the grating unit pattern containing 10 trenches at a pitch of 200 nm, one of the patterns for calibration, was selected by beam deflection, and exposure was accomplished in a desired position on the specimen by beam deflection (step 81). The dosage for this delineation was 10 µC/cm², adequate for the resolution of the grating unit pattern containing 10 trenches at a pitch of 200 nm (step 82).

Next, an aperture 40 corresponding to the grating unit pattern containing 20 trenches at a pitch of 100 nm, another of the patterns for calibration, was selected by beam deflection, and exposure was accomplished in a desired position on the specimen by beam deflection (step 83). The dosage for this delineation was 15 µC/cm², adequate for the resolution of the grating unit pattern containing 20 trenches at a pitch of 100 nm (step 84).

Next, by using a square aperture for variable shaped method 36, exposure was accomplished to place the marks 400 and 401 for correcting the specimen rotation on the left and right sides of the periphery where exposure had been accomplished for the grating pattern (step 85). The dosage for this delineation was 7 µC/cm², adequate for the resolution of the mark pattern (step 86).

In the same way, the grating pattern in the lateral direction was delineated. An aperture 37 corresponding to the grating unit pattern containing 10 trenches at a pitch of 200 nm, one of the patterns for calibration, was selected by beam deflection, and exposure was accomplished to place the grating pattern in the lateral direction in a desired position on the specimen by beam deflection. The dosage for this delineation was 10 µC/cm², adequate for the resolution of the grating unit pattern containing 10 trenches at a pitch of 200 nm. Next, an aperture 39 corresponding to the grating unit pattern containing 20 trenches at a pitch of 100 nm, another of the patterns for calibration, was selected by beam deflection, and exposure was accomplished to place it in a desired position on the specimen by beam deflection. The dosage for this delineation was 15 µC/cm², adequate for the resolution of the grating unit pattern containing 20 trenches at a pitch of 100 nm.

After development, the oxide film was etched with the resist as the mask, and then the Si substrate was dry-etched (step 87).

For delineation, both vertical and lateral directions of the grating pattern were prepared in advance on the same substrate by electron-beam exposure as described above. As the use of the electron-beam cell projection method for the grating pattern resulted in exposure of any position of the specimen with the same stencil mask, it was made possible to form a uniform pattern with dimensional fluctuations of no more than 5 nm.

Incidentally, as the distances between different gratings can be shortened in the example of pattern shown in FIG. 1, there is provided an advantage that proof by SEM can be accurately accomplished.

Figure 2:
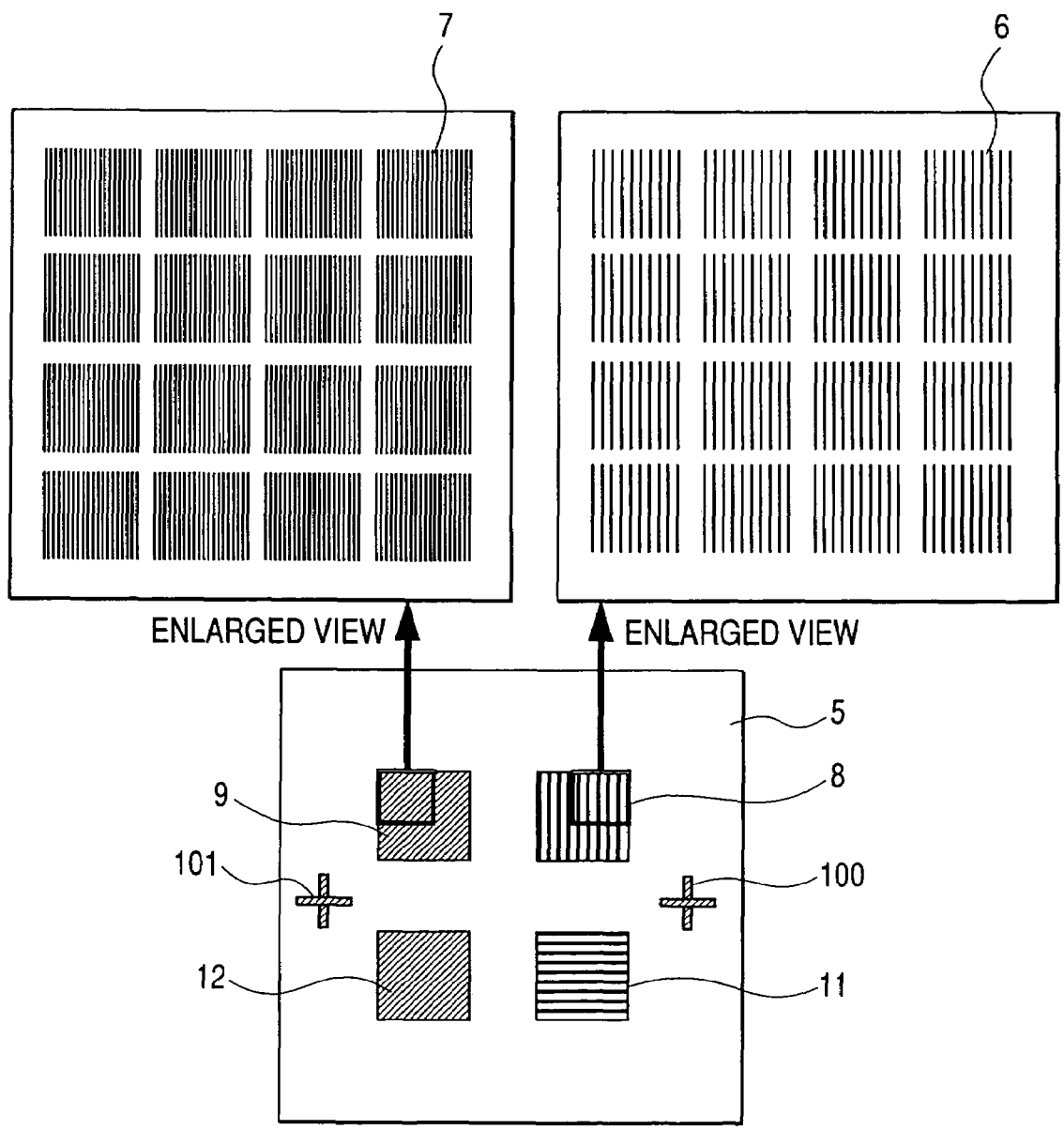
FIG. 2 shows the example of pattern array for calibration in FIG. 1 from another aspect.

FIG. 2 shows another example of standard reference for metrology according to the invention. In the grating pattern shown in FIG. 2, grating unit patterns 6 containing 10 trenches of 2 µm in length at a pitch of 200 nm are arrayed in a calibration pattern area 8 of 2 mm square at pitches of 2.5 µm and 2.4 µm in the vertical and lateral directions, respectively. In the vicinity of this area, a grating unit pattern 7 in which 20 trenches of 2 µm in length are arrayed at a pitch of 100 nm is arranged in a calibration pattern area 9 of 2 mm square, as in the figure. In the peripheries of the grating patterns, cross marks for beam addressing 100 and 101 are arranged.

Figure 3:
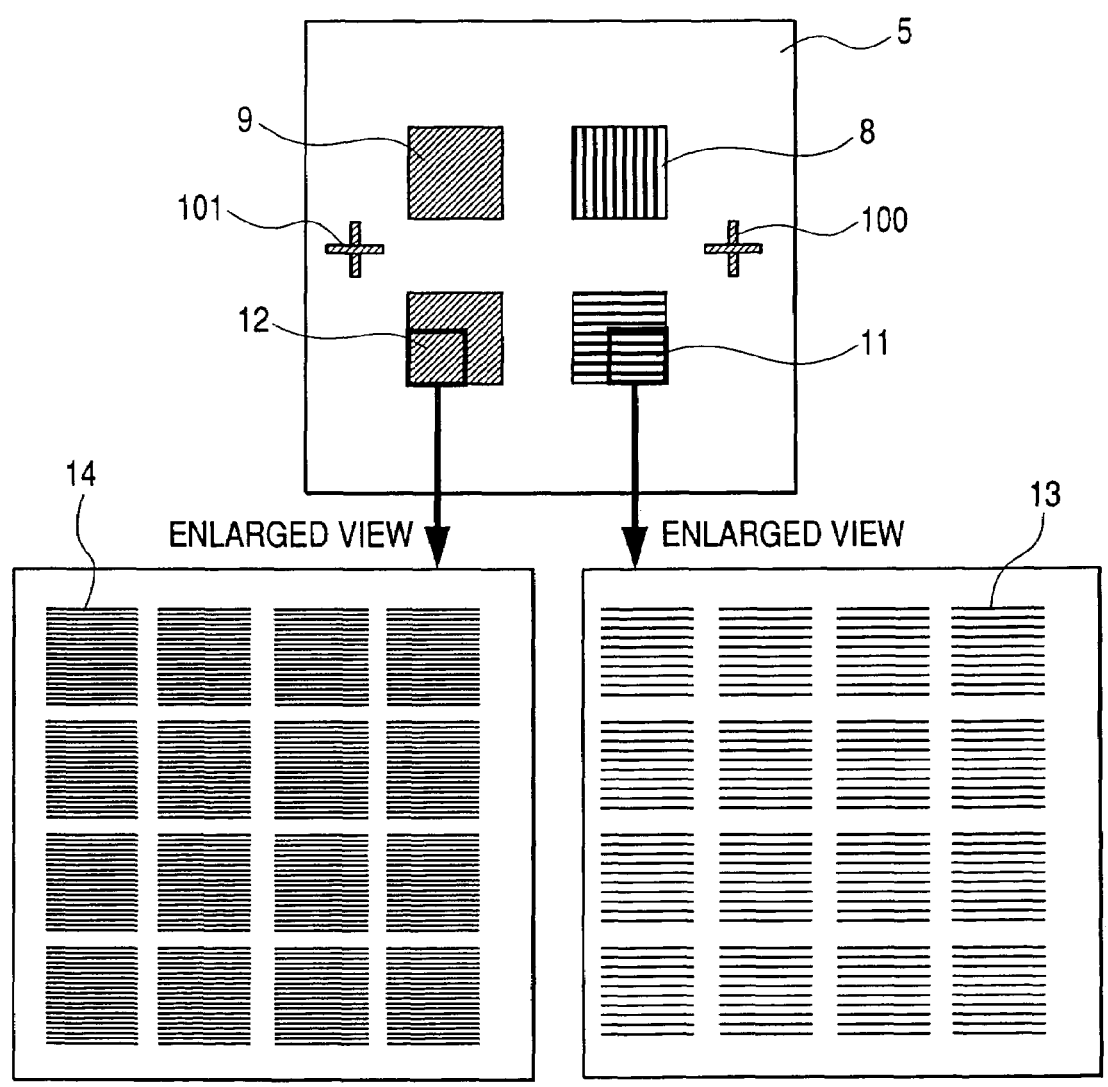
FIG. 3 shows another example of pattern array for calibration in the standard reference for metrology according to the invention.

On the standard reference substrate 5, there are arranged, in addition to these patterns, calibration pattern areas 11 and 12 of 2 mm square, each containing grating arrays in which lines of the grating unit are laterally arranged as illustrated. FIG. 3 shows details of these areas. In these calibration pattern areas 11 and 12, grating unit patterns 13 and 14 are laterally arrayed at the same lengths and at the same pitches as in the grating unit patterns 6 and 7, respectively.

The diffraction angle was measured by irradiating with an He—Cd laser, whose wavelength was guaranteed as an absolute size, a 2-mm square area in this standard reference, the area in which grating unit patterns 6 containing 10 trenches at a pitch of 200 nm were arrayed at pitches of 2.5 µm and 2.4 µm in the vertical and lateral directions, respectively, and it was thereby proven with a tolerance of 0.01 nm that the pitch size of the grating unit patterns 6 was 200.02 nm. The pitch size of the grating unit patterns 7 in which 20 trenches were arrayed at a pitch of 100 nm was found to be 100.40 nm by diffraction angle measurement with a deep ultraviolet solid-state laser of 193 nm in wavelength. In this measurement, first the pitch size of the grating unit pattern 6 containing 10 trenches at a pitch of 200 nm was determined by diffraction angle measurement with a deep ultraviolet solid-state laser of the same wavelength 193 nm, and by measuring the diffraction angle by irradiation with an He—Cd laser whose wavelength was guaranteed as an absolute size a value of 200.02 nm was obtained. The diffraction angle measurement with the deep ultraviolet solid-state laser of 193 nm in wavelength was thereby calibrated.

Next will be described the calibration of the electron-beam metrology system using this standard reference for metrology. The specimen wafer 32 containing a device pattern of 50 nm in designed size and the standard reference are mounted on the electron-beam metrology system as shown in FIG. 7. The device pattern of 50 nm in designed size is measured with the electron-beam metrology system at a magnification power of 200,000 or more. If a grating of 200 nm in pitch, which is the conventional size standard, is measured at this magnification power, one pitch will overflow electron-beam scanning, and therefore the system cannot be calibrated.

For calibration at this magnification power, the pitch size of the grating unit pattern 7 was measured with the electron-beam metrology system. First, the parallelism between the moving directions of the specimen and the electron-beam metrology system was corrected by using the cross marks for beam addressing 100 and 101 to find the grating unit pattern 7 in which 20 trenches were arrayed at a pitch of 100 nm. Next, the pitch size of the grating unit pattern 7 in the array was measured. In the same way, the pitch sizes of 20 or more different grating unit patterns 7 were measured, and calibration was successfully accomplished by averaging the measurements to 100.40 nm. In order to confirm the correctness of this calibration, the pitch size of the grating unit pattern 6 containing 10 trenches at a pitch of 200 nm in the array was measured at 100,000 magnifications, a power permitting one pitch to be covered by scanning, and a pitch size of 200.08 nm was obtained. The result was so satisfactory that the difference from the pitch size of 200.02 nm obtained by measuring the diffraction angle was only 0.06 nm. In the same way, measurement calibration of the electron-beam metrology system in the lateral direction was successfully achieved with high accuracy by using the array of the grating unit patterns 14 in which 20 trenches were arrayed at a pitch of 100 nm and that of the grating unit patterns 13 in which 10 trenches were arrayed at a pitch of 200 nm incorporated into the standard reference pattern in the lateral direction as shown in FIG. 3.

Incidentally, the examples of pattern shown in FIG. 2 and FIG. 3, as the calibration pattern areas are separate, have an advantage that both the pattern of the greater pitch size and that of the smaller pitch size can be proven by optical diffraction.

Figure 4:
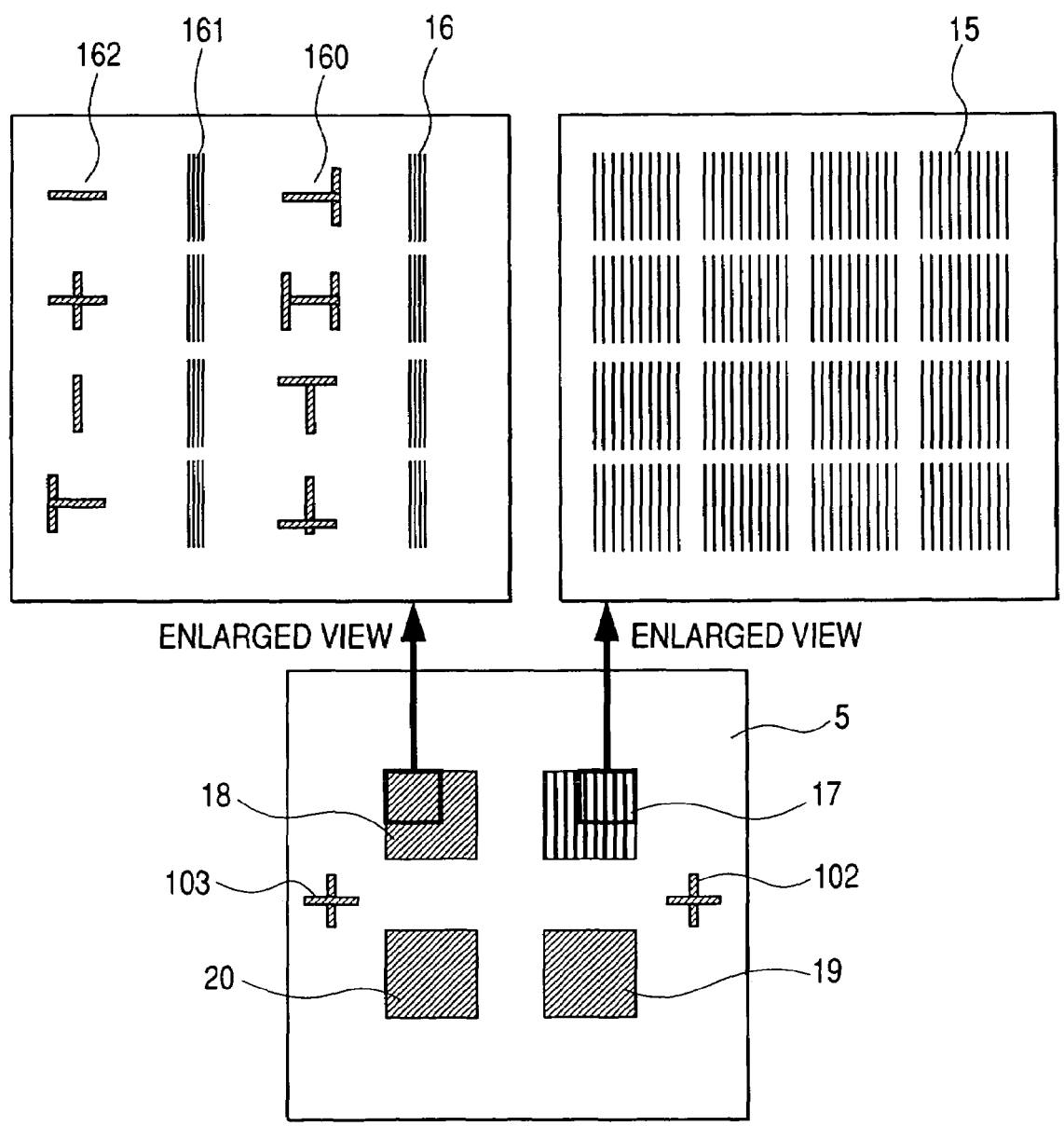
FIG. 4 shows still another example of pattern array for calibration in the standard reference for metrology according to the invention.

FIG. 4 shows still another example of standard reference for metrology according to the invention. In the grating pattern shown in FIG. 4, grating unit patterns 15 containing 10 trenches of 2 μm in length at a pitch of 200 nm are arrayed at pitches of 2.5 μm and 2.4 μm in the vertical and lateral directions, respectively, in a calibration pattern area 17 of 2 mm square. In the vicinities of this area, grating unit patterns 16 and 161 in which four trenches of 2 μm are arrayed at a pitch of 100 nm are arranged in a calibration pattern area 18 of 2 mm square as illustrated. In positions laterally away from these grating unit patterns having four trenches by 2 μm each, mark patterns 160 and 162 different in shape from one another, by one or another of which the position of each grating unit pattern can be identified, are placed. Further, cross marks for beam addressing 102 and 103 are arranged in the peripheries of the grating patterns.

Over this standard reference substrate 5, calibration pattern areas 19 and 20 of 2 mm square each, containing grating arrays in which the trenches of the grating unit pattern 15 are arrayed in the lateral direction, are arranged in addition to these patterns.

The diffraction angle was measured by irradiating with an He—Cd laser whose wavelength was guaranteed as an absolute size a 2-mm square area in this standard reference, the area in which the grating unit patterns 15 containing 10 trenches at a pitch of 200 nm are arrayed at pitches of 2.5 μm and 2.4 μm in the vertical and lateral directions, respectively, and it was thereby proven with a tolerance of 0.01 nm that the pitch size of the grating unit patterns 15 was 200.01 nm. Further, the pitch size in the central part of the grating unit patterns 16 containing four trenches at a pitch of 100 nm was determined by using a scanning probe microscope in the following manner, and values of 100.55 nm and 100.65 nm were obtained.

First, the parallelism between the moving directions of the specimen and the scanning probe microscope was corrected by using the cross marks 102 and 103 for beam addressing to find the grating unit pattern, and the position toward each grating unit was kept at or below 2 μm. Next, after carrying out size calibration of the scanning probe microscope by measuring the pitch size in the central part of the grating unit pattern 15 containing 10 trenches at a pitch of 200 nm in the array and setting this size to 200.01 nm, the pitch size of the grating unit patterns 16 was measured. Since the grating unit patterns 16 were 2 μm long, scanning by the scanning probe microscope was successfully was positioned to the grating unit patterns with 100% correctness. The positions of the measured grating patterns allowed discrimination by scanning the mark pattern 160 located nearby.

Next will be described calibration of the electron-beam metrology system using this standard reference for metrology. This electron-beam metrology system has a system configuration as shown in FIG. 12, and calibration was performed in accordance with a calibration program so designed that the calibration could be accomplished in the procedure charted in FIG. 11. In the measuring procedure, an electron-beam 42 radiating from an electron-gun 41 was narrowed with lenses 43 and 45, secondary electrons 48 generated when a specimen 46 mounted on a stage 47 was scanned by a deflector 44 were detected by a secondary electron detector 49, and the waveform was determined by a beam deflection control unit and a secondary electron signal treatment unit. The size was computed from this waveform, and was displayed and stored as the correct line width through line width calibration operation. The electron-beam metrology system according to the invention further has a differential operation unit and a calibration state display unit for comparison for calibration as shown in FIG. 12, and the correctness of calibration is verified by comparison with different reference sizes, and can be displayed.

The actual measuring procedure will be described below. The specimen wafer 32 and the standard reference containing a device pattern of 50 nm in designed size are mounted on the electron-beam metrology system as shown in FIG. 7. The device pattern of 50 nm in designed size is measured with the electron-beam metrology system at a magnification power of 200,000. In a grating of 200 nm in pitch, which is the conventional size standard, is measured at this magnification power, one pitch will overflow electron-beam scanning, and therefore the system cannot be calibrated.

Figure 11:
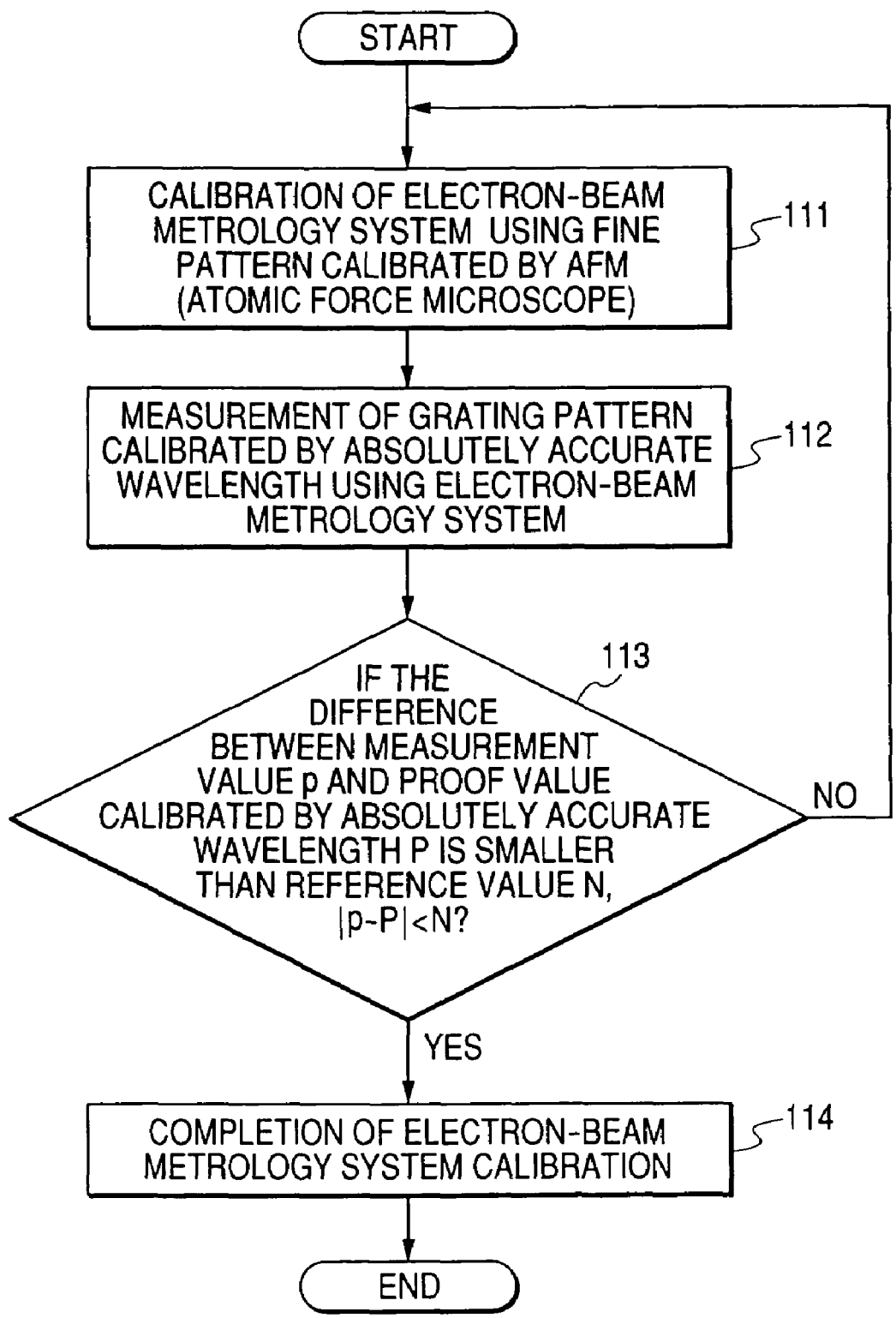
FIG. 11 shows an example of flow in the calibration of the electron-beam metrology system according to the invention.
Figure 12:
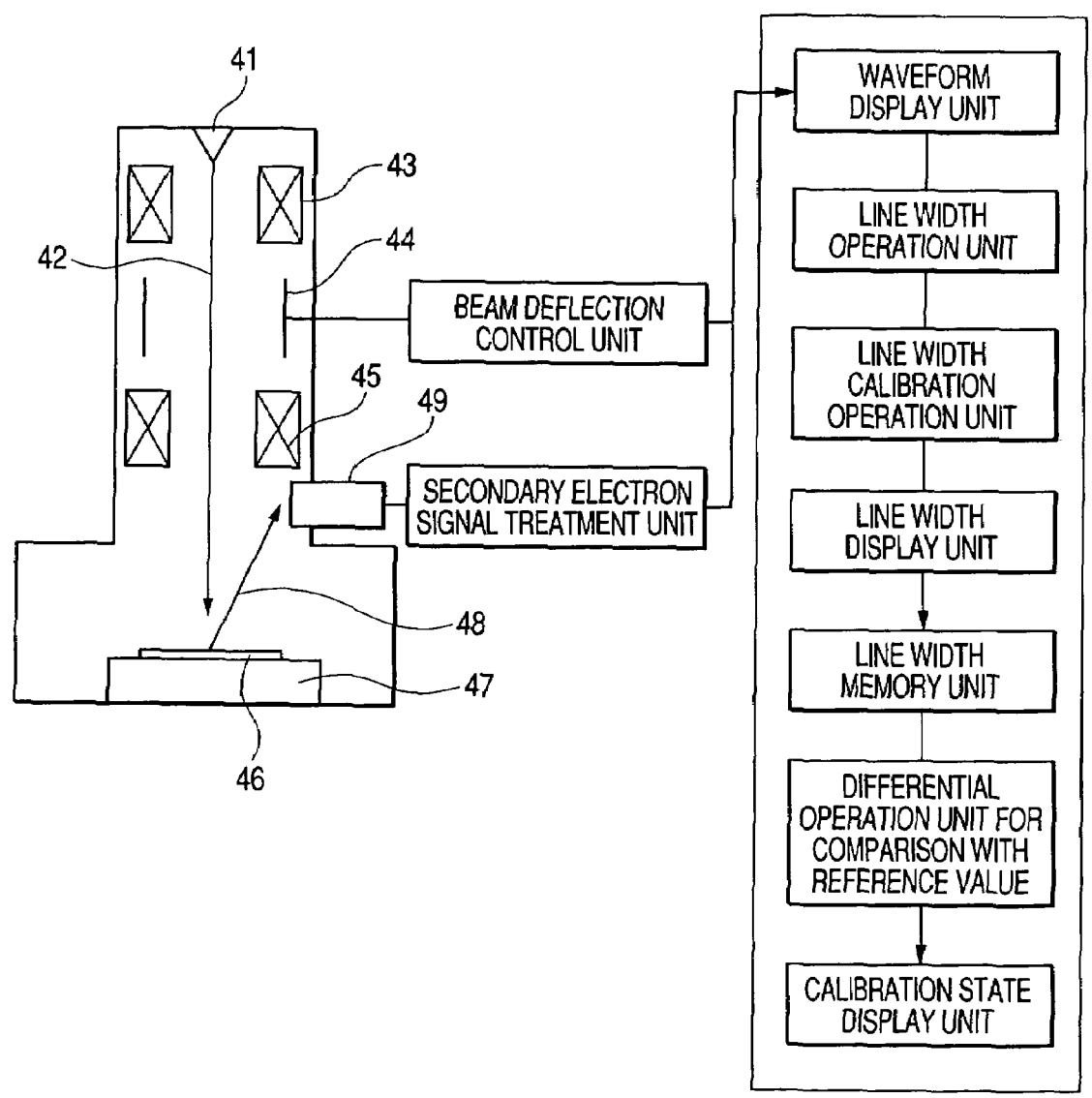
FIG. 12 shows an example of configuration of an electron-beam metrology system according to the invention.

The calibration of this magnification power was accomplished in the procedure charted in FIG. 11. The pitch size of the grating unit pattern 16 was measured with the electron-beam metrology system. First, the parallelism between the moving directions of the specimen and the scanning probe microscope was corrected by using the cross marks for beam addressing 102 and 103 to find the grating unit pattern 16 in which four trenches were arrayed at a calibrated pitch of 100 nm. Then, the pitch size of the grating unit pattern 16, calibrated on the basis of the mark pattern 160 in the array, was measured by displaying and storing in the line width memory unit the size according to the waveform display and line width operation obtained from the beam deflection control unit and the secondary electron signal treatment unit. That pitch value was calibrated with the line width calibration operation unit to make it 100.55 nm, and calibration was accomplished by storing that line width into the storage unit (step 111).

In order to confirm the correctness of the calibration, the pitch size of the grating unit pattern 1 containing 10 trenches at a pitch of 200 nm in this array was measured at 100,000 magnifications, a power permitting one pitch to be covered by scanning, through the line width calibration operation unit calibrated according to the configuration of FIG. 12, and a pitch size of 200.03 nm was obtained (step 112). The difference from the pitch size of 200.01 nm obtained by measuring the diffraction angle was 0.02 nm. As this difference was not more than 0.1 nm, set as the reference value (step 113), a display of normality was instructed by the differential operation unit for comparison with reference value to the calibration state display unit, and a satisfactory measurement was guaranteed (step 114). In the same way, measurement calibration of the electron-beam metrology system in the lateral direction was successfully achieved with high accuracy by using the grating unit pattern array 20 in which four trenches were arrayed at a pitch of 100 nm in the lateral direction and the grating unit patterns 19 in which 10 trenches were arrayed at a pitch of 200 nm incorporated into the same standard reference pattern as what is shown in FIG. 4.

Next, similar calibration was carried out three months later using the same grating patterns as the above-described. First, the parallelism between the moving directions of the specimen and the electron-beam metrology system was corrected by using the cross marks for beam addressing 102 and 103 to find the grating unit pattern 16 in which four trenches were arrayed at a calibrated pitch of 100 nm, and then the pitch size of the grating unit pattern 16, placed in the same position as before and calibrated on the basis of the mark pattern 160 in the array, was measured. Calibration was successfully accomplished by making the pitch value 100.55 nm.

In order to confirm the correctness of the calibration, the pitch size of the grating unit pattern 15 containing 10 trenches at a pitch of 200 nm in this array was measured at 100,000 magnifications, a power permitting one pitch to be covered by scanning, and a pitch size of 200.25 nm was obtained. As its difference from the pitch size of 200.01 nm obtained by measuring the diffraction angle was 0.24 nm, surpassing the 0.1 nm set as the reference of calibration, a display of abnormality was instructed by the differential operation unit for comparison with reference value to the calibration state display unit of the electron-beam metrology system (step 115).

For this reason, in accordance with the procedure charted in FIG. 11, a grating unit pattern 161 which was in another position and in which four trenches were arrayed at a calibrated pitch of 100 nm was identified on the basis of the mark pattern 162, and calibration was successfully accomplished by measuring its pitch size to determine the size to be 100.65 nm (step 111). In order to confirm the correctness of the calibration, the pitch size of the grating unit pattern 15 containing 10 trenches at a pitch of 200 nm in this array was measured at 100,000 magnifications, a power permitting one pitch to be covered by scanning, and a pitch size of 200.02 nm was obtained (step 112). The difference from the pitch size of 200.01 nm obtained by measuring the diffraction angle was a satisfactory result of 0.01 nm (step 113), indicating that highly accurate calibration was maintained and stable measurement performance was successfully continued (step 114).

Figure 10:
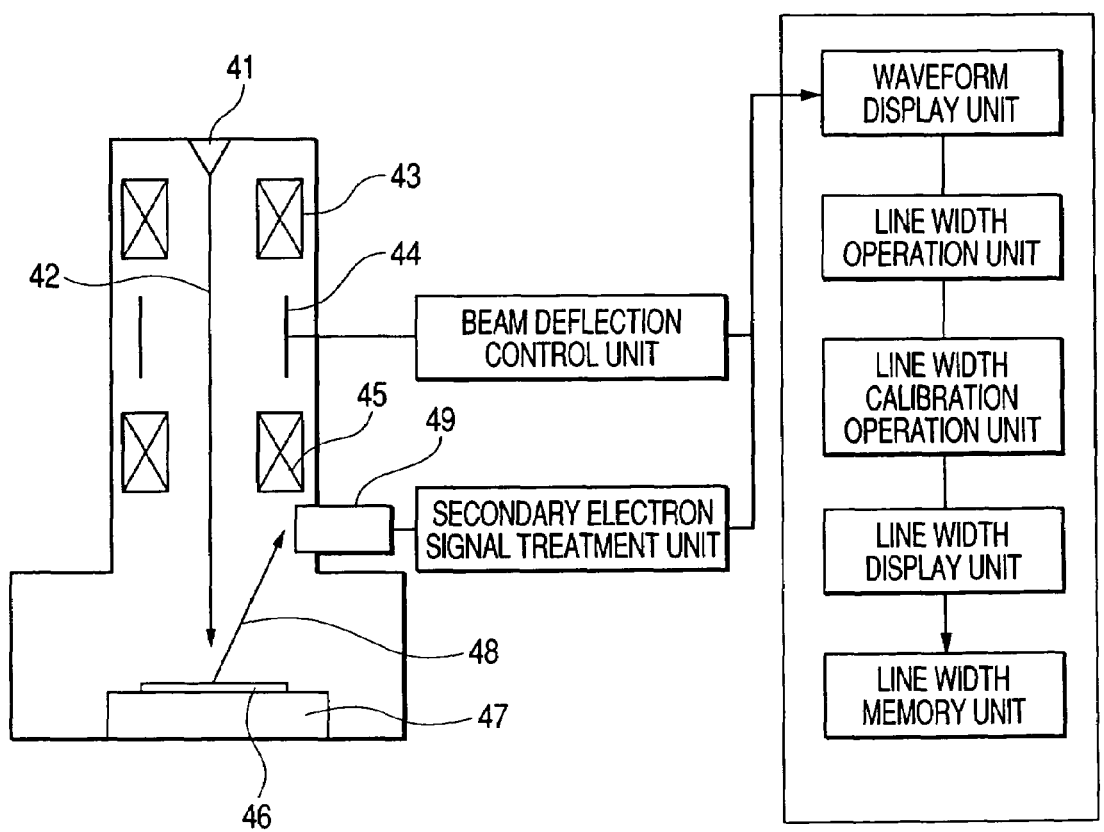
FIG. 10 shows the configuration of an electron-beam metrology system according to the prior art.

By contrast, in system calibration using the conventional electron-beam metrology system of the configuration shown in FIG. 10 and the conventional calibration pattern 28 shown in FIG. 6, the calibration pattern 28 is used many times during the long-term operation for months as mentioned above. For this reason, if contamination by irradiation with electron-beams gives rise to size variations in calibration pattern, the accuracy cannot be guaranteed on account of the absence of a function to compare with a plurality of size references or to display whether calibration is satisfactory or not.

Incidentally, the example of pattern shown in FIG. 4 has an advantage of permitting ready measurement with an AFM or the like because the position of the pattern of the smaller pitch size can be identified.

Figure 5:
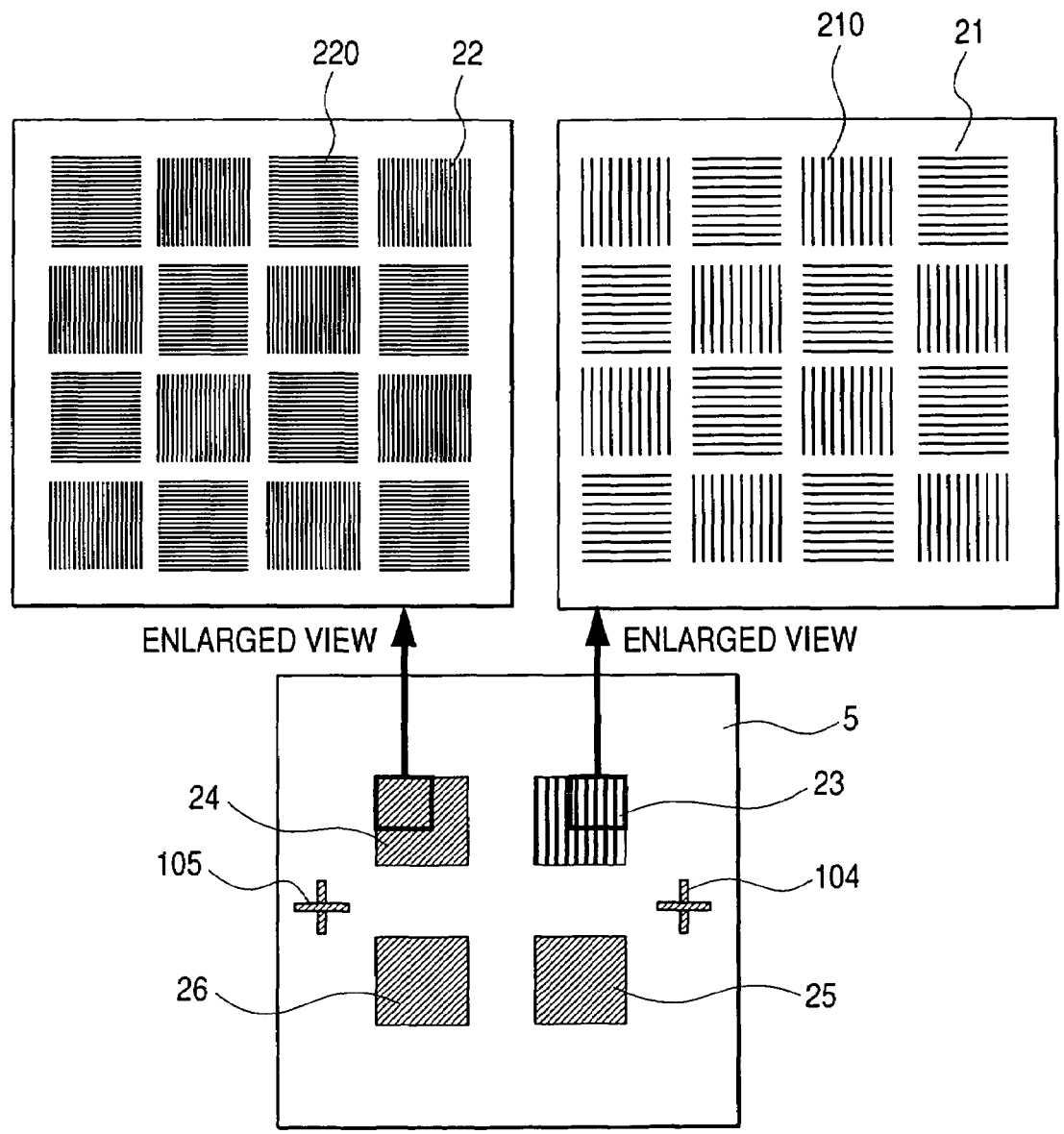
FIG. 5 shows yet another example of pattern array for calibration in the standard reference for metrology according to the invention.

FIG. 5 shows yet another example of standard reference for metrology according to the invention. Referring to FIG. 5, the grating pattern is such that grating unit patterns 21 containing 10 trenches of 2 μm in length at a pitch of 200 nm are arrayed at pitches of 2.5 μm and 2.4 μm in the vertical and lateral directions, respectively, in a calibration pattern area 23 of 2 mm square. In part of this array, grating unit patterns 210 containing 10 trenches at a pitch of 200 nm in the lateral direction are arranged as illustrated. In the vicinity of this area, grating unit patterns 22 in which 20 trenches of 2 μm in length are arrayed at a pitch of 100 nm are arrayed in a calibration pattern area 24 of 2 mm square as illustrated. In part of this array, grating unit patterns 220 containing 20 trenches in the lateral direction at a pitch of 100 nm are arranged as shown in FIG. 5. In the peripheries of the grating pattern 1, cross marks for beam addressing 104 and 105 are arranged.

The diffraction angle was measured by irradiating with an He—Cd laser whose wavelength was guaranteed as an absolute size the 2 mm square calibration pattern area 23 in this standard reference, the area in which grating unit patterns 21 and 210 containing 10 trenches at a pitch of 200 nm are arrayed at pitches of 2.5 μm and 2.4 μm in the vertical and lateral directions, respectively, and it was thereby proven with a tolerance of 0.01 nm that the pitch size of both grating unit patterns 21 and 210 was 200.02 nm. Further, the pitch sizes of grating unit patterns 22 and 220 containing 20 trenches at a pitch of 100 nm were determined by diffraction angle measurement using a deep ultraviolet solid-state laser of 193 nm in wavelength, and a value of 100.40 was obtained for both. In this measurement, first the pitch sizes of the grating unit patterns 21 and 210 containing 10 trenches at a pitch of 200 nm were determined by diffraction angle measurement with a deep ultraviolet solid-state laser of the same wavelength 193 nm, and by measuring the diffraction angle by irradiation with an He—Cd laser whose wavelength was guaranteed as an absolute size, a value of 200.02 nm was obtained. The diffraction angle measurement with the deep ultraviolet solid-state laser of 193 nm in wavelength was thereby calibrated.

Next, calibration of the electron-beam metrology system using this specimen will be described. The specimen wafer 32 and the standard reference containing a device pattern of 50 nm in designed size are mounted on the electron-beam metrology system as shown in FIG. 7. The device pattern of 50 nm in designed size is measured with the electron-beam metrology system at a magnification power of 200,000. In a grating of 200 nm in pitch, which is the conventional size standard, is measured at this magnification power, one pitch will overflow electron-beam scanning, and therefore the system cannot be calibrated.

For calibration at this magnification power, the pitch size of the grating unit pattern 22 was measured with the electron-beam metrology system. First, the parallelism between the moving directions of the specimen and the electron-beam metrology system was corrected by using the cross marks for beam addressing 104 and 105 to find the grating unit pattern 22 in which 20 trenches were arrayed at a pitch of 100 nm. Then, the pitch size of the grating unit pattern 22 in the array was measured. In the same way, the pitch sizes of 20 or more different grating unit patterns were measured, and calibration was successfully accomplished by averaging the measurements to 100.40 nm. In order to confirm the correctness of this calibration, the pitch size of the grating unit pattern 21 containing 10 trenches at a pitch of 200 nm in the array was measured at 100,000 magnifications, a power permitting one pitch to be covered by scanning, and a pitch size of 200.08 nm was obtained. The result was so satisfactory that the difference from the pitch size of 200.02 nm obtained by measuring the diffraction angle was only 0.06 nm. In the same way, measurement calibration of the electron-beam metrology system in the lateral direction was successfully achieved with high accuracy within a tolerance of 0.1 nm by using the array of the grating unit patterns 220 in which 20 trenches were arrayed at a pitch of 100 nm and the array of the grating unit patterns 210 in which 10 trenches were arrayed at a pitch of 200 nm incorporated into the standard reference pattern in the lateral direction. Since the distance between these grating units in the vertical and lateral directions was 2.5 μm, within the 20 μm range in which measurement is possible without altering the focusing condition of the electron-beam metrology system, calibration of high accuracy could be realized in both vertical and lateral directions.

Incidentally, the example of pattern shown in FIG. 5 has an advantage of permitting highly accurate calibration in both vertical and lateral directions because the vertical and lateral directions are close to each other.

Although the description of the standard reference for calibration in each of the foregoing examples referred to what was configured by sticking a patterned semiconductor substrate 35 to the holder 34 as shown in FIG. 7, highly accurate measurement is also possible, even if the patterned semiconductor substrate has the same wafer shape as the wafer 32 intended to be measured, by first calibrating the system mounted with the standard reference for calibration use, then replacing it with the wafer 32 to be measured and measuring it.

Further, though the foregoing description refers to grating arrays in each of which trenches of grating unit patterns are arrayed in vertical and lateral directions as shown in FIG. 2 through FIG. 5, obviously the applicability of the invention is not limited to these grating arrays but also covers such grating arrays in which the trenches of grating unit patterns are arrayed in mutually different directions.

As hitherto described, the present invention makes possible dimensional calibration for smaller pitch sizes than what is proven by an optical diffraction angle with a laser whose wavelength is absolutely guaranteed. Furthermore, the invention makes possible setting of a pitch size proven by an optical diffraction angle with a laser whose wavelength is absolutely guaranteed and a reference pattern finer than that and realization of a guarantee of the appropriateness of calibration by comparing the two reference sizes, thereby enabling highly accurate electron-beam metrology to be accomplished. Highly accurate calibration of metrology is further made possible for patterns in vertical and lateral directions by arranging two mutually orthogonal patterns over the same substrate.

What is claimed is:

1. An electron-beam metrology system comprising:
   a specimen stage to mount a specimen on which a device pattern is formed;
   electron optics to radiate the device pattern with an electron-beam;
   a secondary electron detector to detect a secondary electron generated by the radiation of the electron-beam; and
   an information processing system to analyze a signal obtained from the secondary electron detector;
   wherein a standard reference for metrology is held on the specimen stage; and
   wherein the standard reference comprises:
   a first grating unit pattern including an array of gratings having pitch sizes which are verified by an optical method;
   a second grating unit pattern including an array of gratings having pitch sizes which are smaller than the pitch sizes of the first grating unit pattern; and
   a positioning mark.

2. An electron-beam metrology system according to claim 1, wherein parallelism of a moving direction of the specimen stage is corrected on the basis of the positioning mark.

3. An electron-beam metrology system according to claim 1, wherein the positioning mark is used to search for the first grating pattern.

4. An electron-beam metrology system according to claim 1, wherein a measurement result of the device pattern is calibrated utilizing information obtained from the standard reference.

5. An electron-beam metrology system according to claim 4, further comprising a display on which the calibrated measurement result is displayed.

6. An electron-beam metrology system according to claim 1, further comprising:
   storage means which stores a size standard value for metrology;
   wherein the size standard value is an average value of plural pitch sizes of the second grating unit obtained by plural measurements of the second grating unit.

7. An electron-beam metrology system according to claim 6, wherein the information processing system confirms whether the stored size standard value satisfies a predetermined correctness or not by comparing a measurement result of a pitch size of the first grating unit pattern and the verified pitch size by the optical method.

8. An electron-beam metrology system according to claim 7, wherein a reference value for the confirmation is stored in the storage means.

9. An electron-beam metrology system according to claim 7, further comprising a display which displays an alarm when the size standard value does not satisfy the predetermined correctness.

10. An electron-beam metrology system according to claim 1, wherein the information processing system measures a size of the device pattern using the pitch size of the second grating pattern as the size standard, and verifies the measurement result by comparing a measurement result of a pitch size of the first grating unit pattern and the verified pitch size by the optical method.

11. An electron-beam metrology system according to claim 10, further comprising a display which displays an alarm when the measurement result is not verified.

12. An electron-beam metrology system comprising:
   a specimen stage to mount a specimen on which a device pattern is formed;
   electron optics to radiate the device pattern with an electron-beam;
   a secondary electron detector to detect a secondary electron generated by the radiation of the electron-beam;
   an information processing system to analyze a signal obtained from the secondary electron detector; and storing means which stores a size standard value for measuring a size of the deice pattern;

wherein the size standard value stored in the storing means is obtained by using a standard reference comprising:

a first grating unit pattern including an array of gratings having pitch sizes which are verified by an optical method; and a second grating unit pattern including an array of gratings having pitch sizes which are smaller than the pitch sizes of the first grating unit pattern.

13. An electron-beam metrology system according to claim 12, the size standard is an average value of plural pitch sizes of the second grating unit obtained by a plural measurements of the second grating unit.

14. An electron-beam metrology system according to claim 13, the size standard is verified by comparing a measurement result of a pitch size of the first grating unit pattern and the verified pitch size by the optical method.

* * * * *